(12) United States Patent
Kuriyama

(10) Patent No.: US 7,629,872 B2
(45) Date of Patent: Dec. 8, 2009

(54) CHIP TYPE COMPONENT AND ITS MANUFACTURING PROCESS

(75) Inventor: Takahiro Kuriyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/661,017

(22) PCT Filed: May 12, 2005

(86) PCT No.: PCT/JP2005/008716

§ 371 (c)(1),
(2), (4) Date: Feb. 23, 2007

(87) PCT Pub. No.: WO2006/022055

PCT Pub. Date: Mar. 2, 2006

(65) Prior Publication Data

US 2007/0296542 A1    Dec. 27, 2007

(30) Foreign Application Priority Data

Aug. 26, 2004   (JP) .............................. 2004-246916

(51) Int. Cl.
*H01C 1/012*     (2006.01)

(52) U.S. Cl. ..................... 338/309; 338/314; 338/328; 252/512; 29/613

(58) Field of Classification Search ......... 338/308–309, 338/313–314, 328, 322; 252/62.3, 500, 506, 252/512; 29/613
See application file for complete search history.

(56) References Cited

U.S. PATENT DOCUMENTS 6,492,896 B2 * 12/2002 Yoneda ....................... 338/309

6,703,683 B2 * 3/2004 Tanimura .................... 257/536

FOREIGN PATENT DOCUMENTS

| JP | 59-9503 | 1/1984 |
| JP | 5-135902 | 6/1993 |
| JP | 7-142203 | 6/1995 |
| JP | 8-64401 | 3/1996 |
| JP | 11260602 | * 9/1999 |
| JP | 2000-30903 | 1/2000 |

OTHER PUBLICATIONS

International Search Report from the corresponding PCT/JP2005/008716, mailed Aug. 16, 2005.

* cited by examiner

*Primary Examiner*—Kyung Lee
(74) *Attorney, Agent, or Firm*—Hamre, Schumann, Mueller & Larson, P.C.

(57) ABSTRACT

A chip-type component 11 includes an insulating chip substrate 12 whose upper surface is provided with a resistor element 13 and a cover coat 14 covering the resister film. At the opposite ends of the substrate, terminal electrode films 15, 16 are formed for the resistor element in a manner such that they extend onto the lower surface 12a of the insulating substrate. The lower surface 12a of the substrate is provided with an insulating projection 18 between the terminal electrode films, where the projection includes a peak portion 18a positioned at or near the center of the insulating substrate in a longitudinal direction along which the terminal electrode films are spaced from each other. This prevents the insulating substrate from breaking when the chip-type component 11 is vacuum-sucked by a collet nozzle 19 to be supplied to a printed circuit board 17.

4 Claims, 4 Drawing Sheets

PRIOR ART

PRIOR ART

CHIP TYPE COMPONENT AND ITS MANUFACTURING PROCESS

TECHNICAL FIELD

The present invention relates to a chip type component, such as a chip resistor, which includes an insulating substrate in the form of a chip and a terminal electrode film for soldering provided on each of opposite ends of the insulating substrate. The invention also relates to a method of manufacturing. such a chip-type component.

BACKGROUND ART

A chip resistor may be configured in the manner shown in FIGS. 5 and 6.

The chip resistor 1a includes an insulating substrate 2a in the form of a chip, on which a resistor film 3a and a cover coat 4a for covering the resistor film 3a are formed. At longitudinally opposite ends of the insulating substrate 2a, terminal electrode films 5a and 6a are formed to be electrically connected to the resistor film 3a. The terminal electrode films 5a and 6a are to be soldered on a printed circuit board 7.

With respect to such a structure, Patent Document 1 teaches that the soldering terminal electrode films 5a and 6a at opposite ends of the insulating substrate 2 are extended onto the lower surface side of the insulating substrate 2a, so that the solderability and soldering strength with respect to the printed circuit board 7 can be enhanced.

FIG. 7 shows a chip resistor 1b disclosed in Patent Document 2. In this chip resistor, while a resistor film 3b and a cover coat 4b for covering the resistor film 3b are formed on the insulating substrate 2b in the form of a chip, soldering terminal electrode films 5b and 6b at opposite ends of the insulating substrate 2b are extended onto the lower surface of the insulating substrate 2b. Further, an insulating projection 8b is provided on the lower surface of the insulating substrate 2b at a location between the terminal electrode films 5b and 6b. With this structure, the terminal electrode films 5b and 6b can be soldered while being spaced upward from the surface of the printed circuit board 7 by an appropriate distance S due to the existence of the projection 8b, so that the thermal expansion with respect to the printed circuit board 7 can be absorbed.

Patent Document 1: JP-A-H07-142203
Patent Document 2: JP-A-2000-30903

DISCLOSURE OF THE INVENTION

Problems to be Solved by the Invention

As shown in the figures, to mount such a chip resistor 1a, 1b on e.g. a printed circuit board 7, the chip resistor 1a, 1b is picked up at the upper surface side by vacuum suction using a collet nozzle 9. Then, in this state, the chip resistor is supplied to a predetermined mount position of the printed circuit board 7 and soldered to the printed circuit board 7.

As shown in FIG. 5, in the case where the terminal electrode films 5a and 6a at longitudinally opposite ends of the insulating substrate 2b are extended onto the lower surface of the insulating substrate 2b like the chip resistor 1a disclosed in Patent Document 1, the terminal electrode films 5a, 6a at the longitudinally opposite ends of the lower surface come into contact with the printed circuit board 7 when the chip resistor 1a is supplied onto the board 7 by vacuum suction using the collet nozzle 9. In this state, almost the center of the upper surface in the longitudinal direction is pressed downward by the collet nozzle 9.

When almost the center, in the longitudinal direction, of the upper surface of the insulating substrate 2a of the chip resistor 1a is pressed downward by the collet nozzle 9 with the terminal electrode films 5a and 6a at the longitudinally opposite ends held in contact with the printed circuit board, bending moment to bend the insulating substrate 2a in the longitudinal direction is exerted on the insulating substrate. Therefore, as indicated by the double-dashed line A in FIG. 5, the insulating substrate 2a is often broken into two, i.e., right and left parts from almost the center in the longitudinal direction.

In the chip resistor 1b disclosed in Patent Document 2, to locate the terminal electrode films 5b and 6b on opposite ends of the insulating substrate 2b at positions spaced upward from the surface of the printed circuit board 7 by an appropriate distance S, the peak portions, i.e., 'the highest portions 8b' of the projection 8b on the lower surface of the insulating substrate 2b are arranged adjacent to the opposite terminal electrode films 5b and 6b.

Therefore, when the chip resistor 1b is supplied onto the printed circuit board 7 with vacuum suction by the collet nozzle 9, the peak portions 8b' of the projection 8b of the chip resistor 1b come into contact with the printed circuit board 7. In this state, almost the center of the upper surface in the longitudinal direction is pressed downward by the collet nozzle 9.

When almost the center of the upper surface in the longitudinal direction of the insulating substrate 2b is pressed downward by the collet nozzle 9 with the peak portions 8b' positioned adjacent to the terminal electrode films 5b and 6b held in contact with the printed circuit board 7 as shown in FIG. 7, bending moment to bend the insulating substrate 2b in the longitudinal direction is exerted on the insulating substrate. Therefore, similarly to the above-described structure, the insulating substrate 2b is often broken into two, i.e., right and left parts from almost the center in the longitudinal direction as indicated by the double-dashed line A' in FIG. 7.

A technical object of the present invention is to provide a chip-type component capable of solving the above-described problem.

Means for Solving the Problems

To achieve the technical object, claim 1 of the present invention provides a chip-type component comprising an insulating substrate which is in the form of a chip and includes an upper surface on which an element and a cover coat for covering the element are provided, and terminal electrode films for the element which are formed at opposite ends of the insulating substrate to extend onto a lower surface of the insulating substrate. The chip-type component further comprises a projection made of an insulating material and provided on the lower surface of the insulating substrate at a location between the terminal electrode films. The projection includes a peak portion positioned at or near the center of the insulating substrate in the longitudinal direction of the substrate along which the terminal electrode films are spaced from each other.

Further, claim 2 of the present invention is characterized in that the peak portion of the projection comprises a ridge extending in the width direction which is perpendicular to the longitudinal direction of the insulating substrate along which the terminal electrode films are spaced from each other.

Further, a method of manufacturing a chip-type component according to the present invention comprises the steps of:

forming an element and a cover coat for covering the element on an upper surface of an insulating substrate in the form of a chip; forming terminal electrode films for electrical connection to the element at opposite ends of the insulating substrate so that the terminal electrode films extend onto a lower surface of the insulating substrate; and forming a projection of an insulating material on the lower surface of the insulating substrate at a location between the terminal electrode films so that the projection includes a peak portion positioned at or near a center of the insulating substrate in a longitudinal direction of the substrate along which the terminal electrode films are spaced from each other.

Advantages of the Invention

In the chip-type resistor of the present invention, the projection formed on the lower surface of the insulating substrate at a location between the terminal electrode films includes a peak portion positioned at or near the center of the insulating substrate in the longitudinal direction. Therefore, when the chip-type resistor is supplied to a predetermined mount position of e.g. a printed circuit board by vacuum suction of the upper surface using a collet nozzle, the peak portion of the projection at the lower surface of the chip resistor comes into contact with the surface of the printed circuit board, and in this state, the chip resistor is pressed downward.

The downward pressing force by the collet nozzle is exerted on the almost center of the insulating substrate in the longitudinal direction, while the peak portion of the projection is positioned at or near the center of the insulating substrate in the longitudinal direction. Therefore, the downward pressing force by the collet nozzle can be supported by the printed circuit board via the peak portion positioned generally on the line of action of the pressing force. Therefore, the bending moment to bend the insulating substrate is not exerted on the insulating substrate or the bending moment exerted on the insulating substrate can be considerably reduced as compared with the structure in which a projection is not provided on the lower surface like Patent Document 1 or the structure in which the peak portion of the projection is positioned close to each of the terminal electrode film like Patent Document 2.

Therefore, according to the present invention, the insulating substrate is reliably prevented from cracking in the longitudinal direction in mounting the chip-type component on e.g. a printed circuit board.

Further, as set forth in claim 2, the peak portion of the projection may be provided as a ridge extending in the width direction which is perpendicular to the longitudinal direction of the insulating substrate along which the terminal electrode films are spaced from each other. With this arrangement, when the chip-type resistor is supplied to a predetermined mount position of e.g. a printed circuit board by vacuum suction of the upper surface using a collet nozzle, the entirety of the ridge extending in the width direction comes into contact with the surface of the printed circuit board. Therefore, the downward pressing force by the collet nozzle can be supported by the printed circuit board via the ridge extending in the width direction.

As a result, the bending moment to bend the insulating substrate in the width direction is prevented from being exerted on the insulating substrate. Therefore, in addition to the cracking of the insulating substrate in the longitudinal direction, cracking in the width direction is also reliably prevented.

DESCRIPTION OF SIGNS

Figure 1:
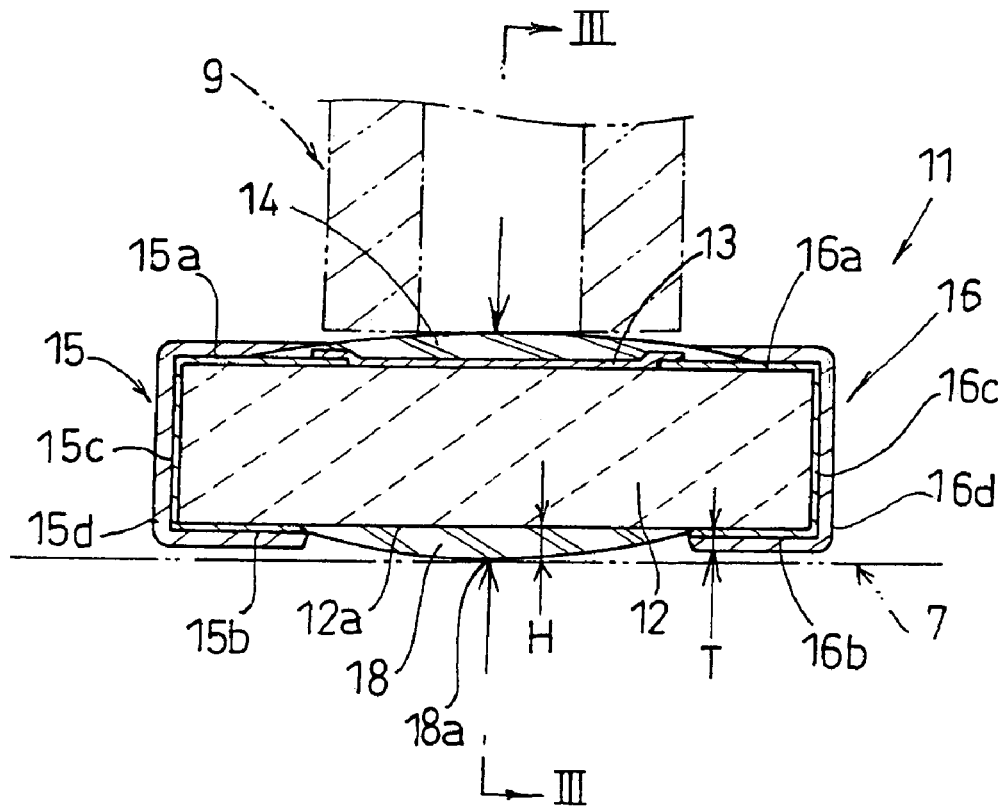
FIG. 1 is a longitudinal sectional view showing a chip resistor according to an embodiment of the present invention.
Figure 2:
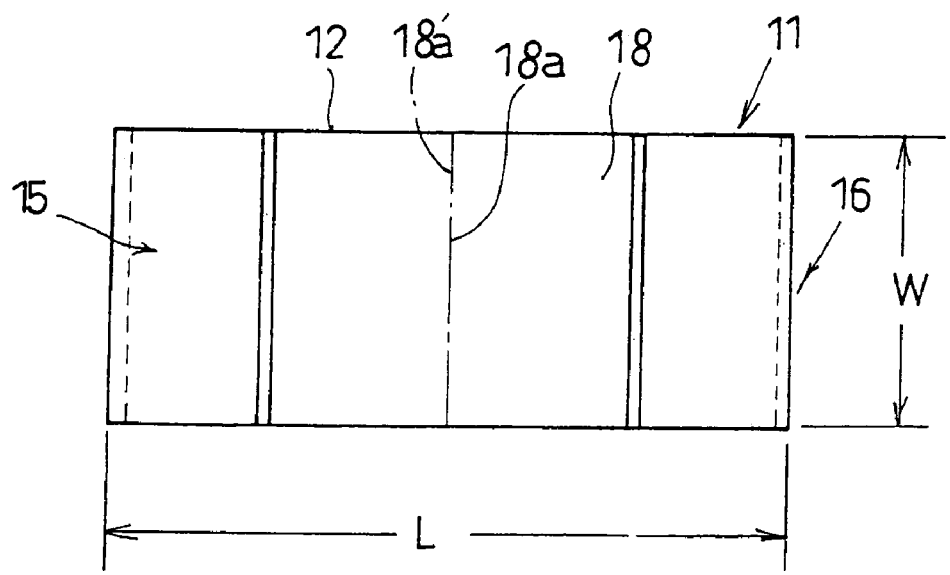
FIG. 2 is a bottom view of FIG. 1.

11 chip resistor
12 insulating substrate
13 resistor film
14 cover coat
15, 16 terminal electrode
18 projection
18a peak portion
18a' ridge of peak portion

BEST MODE FOR CARRYING OUT THE INVENTION

Preferred embodiments of the present invention will be described below with reference to FIGS. 1-4.

In these figures, reference number 11 indicates a chip resistor as an example of chip-type component.

The chip resistor 11 includes an insulating substrate 12 made of a heat-resistant insulating material such as a ceramic material and is in the form of a chip whose length L is larger than the width W. The insulating substrate 12 has an upper surface on which a resistor film 13 and a cover coat 14 for covering the resistor film 13 are formed.

The insulating substrate 12 has longitudinally opposite ends one of which is formed with a terminal electrode film 15 electrically connected to one end of the resistor film 13 and the other end of which is formed with a terminal electrode film 16 electrically connected to the other end of the resistor film 13. Each of the terminal electrode films extends from the upper surface to the lower surface of the insulating substrate 12 across an end surface of the insulating substrate 12.

Though not illustrated, the cover coat 14 is made up of an undercoat made of glass and directly covering the resistor film 13, and an overcoat made of a heat-resistant synthetic resin and laminated on the undercoat. The overcoat may be made of glass.

The two terminal electrode films 15 and 16 include upper electrodes 15a and 16a formed on the upper surface of the insulating film 12 to overlap the insulating film 13, lower electrodes 15b and 16b formed on the lower surface 12a of the insulating substrate 12, side electrodes 15c and 16c formed on the end surfaces of the insulating substrate 12 to partially overlap the upper electrodes 15a, 16a and the lower electrodes 15b, 16b, and metal plating layer 15d and 16d made of e.g. tin or solder on the lower electrodes 15b, 16b and the side electrodes 15c, 16c.

A projection 18 made of glass is provided on the lower surface 12a of the insulating substrate 12 at a location between the two terminal electrode films 15 and 16.

The projection 18 includes a peak portion, i.e., the highest portion 18a positioned at or near the center of the insulating substrate 12 in the longitudinal direction and has a mountain-like shape as a whole which smoothly reduces in height from the peak portion 18a toward the two terminal electrode films 15 and 16.

The peak portion 18a of the projection 18 includes a ridge 18a' extending in the width direction which is perpendicular to the longitudinal direction of the insulating substrate 12. The ridge 18a' extends throughout the width of the insulating substrate 12.

The peak portion 18a of the projection 18 is not limited to a sharp one but may have a flat surface having an appropriate width.

To mount the chip resistor 11 having the above-described structure onto a printed circuit board 7, the chip resistor 11 is picked up at the upper surface side by vacuum suction using a collet nozzle 9, and in this state, supplied to a predetermined mount position of the printed circuit board 7. In supplying the chip resistor, the peak portion 18a of the projection 18 at the lower surface of the chip resistor comes into contact with the printed circuit board 7, and in this state, the chip resistor is pressed downward.

The downward pressing force by the collet nozzle 9 is exerted on the almost center of the insulating substrate 12 in the longitudinal direction, while the peak portion 18a of the projection 18 is positioned at or near the center of the insulating substrate 12 in the longitudinal direction. Therefore, the downward pressing force of the collet nozzle 9 can be supported by the printed circuit board 7 via the peak portion 18a positioned generally on the line of action of the pressing force. Therefore, the bending moment to bend the insulating substrate 12 is not exerted on the insulating substrate or the bending moment exerted on the insulating substrate 12 can be considerably reduced.

Figure 3:
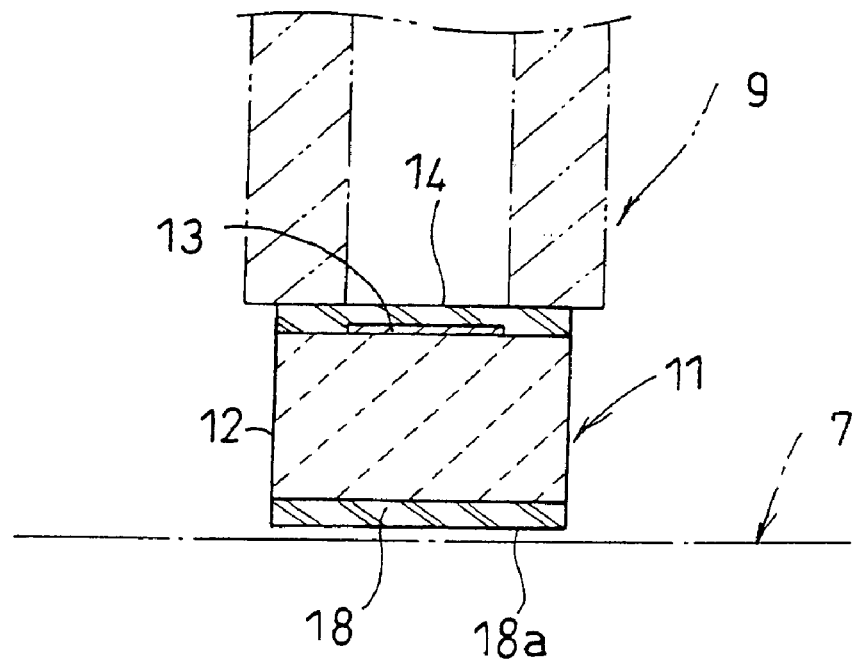
FIG. 3 is a sectional view taken along lines III-III in FIG. 1
Figure 4:
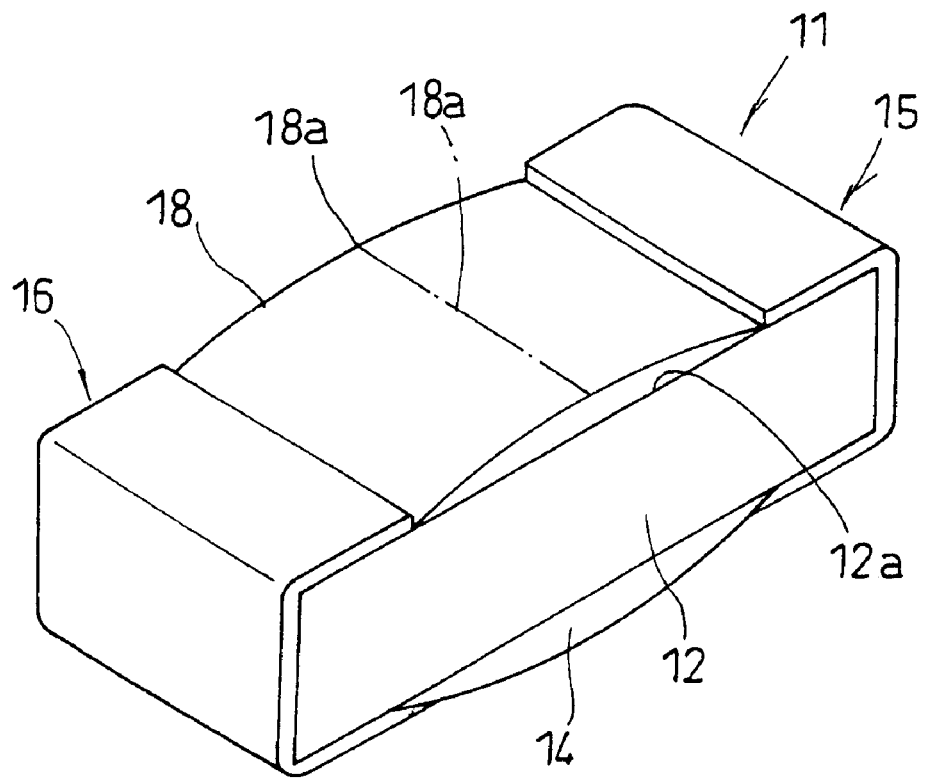
FIG. 4 is a perspective view of the chip resistor of FIG. 1 as viewed from the lower surface side.
Figure 5:
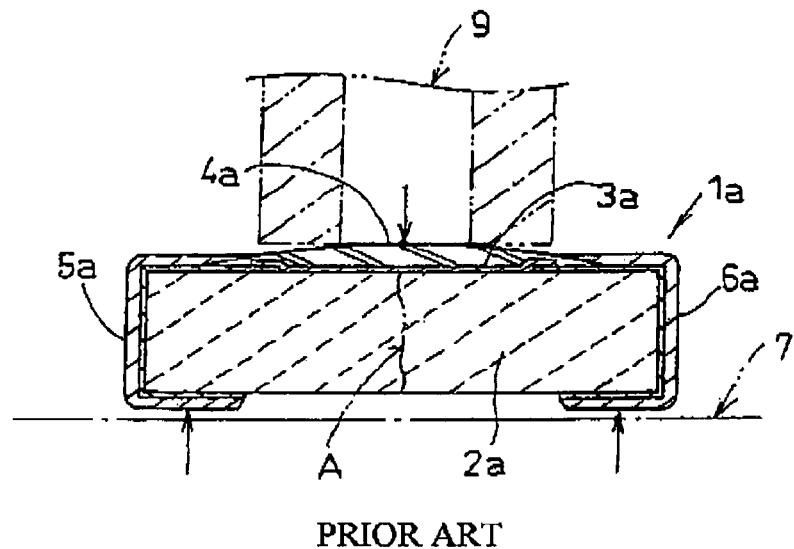
FIG. 5 is a longitudinal sectional view showing a conventional chip resistor.
Figure 6:
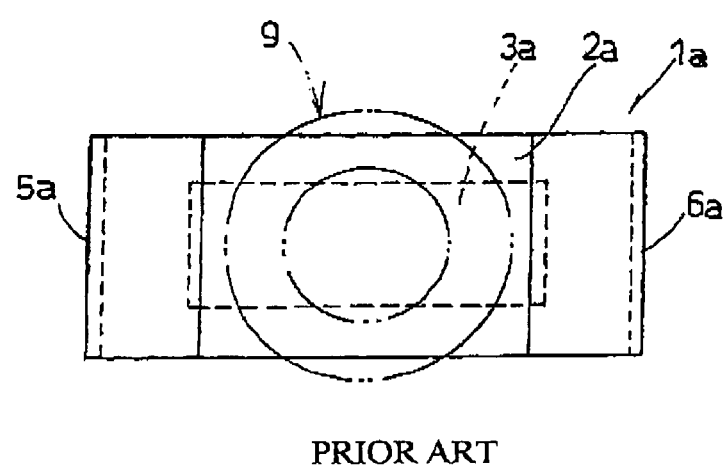
FIG. 6 is a plan view of FIG. 5.
Figure 7:
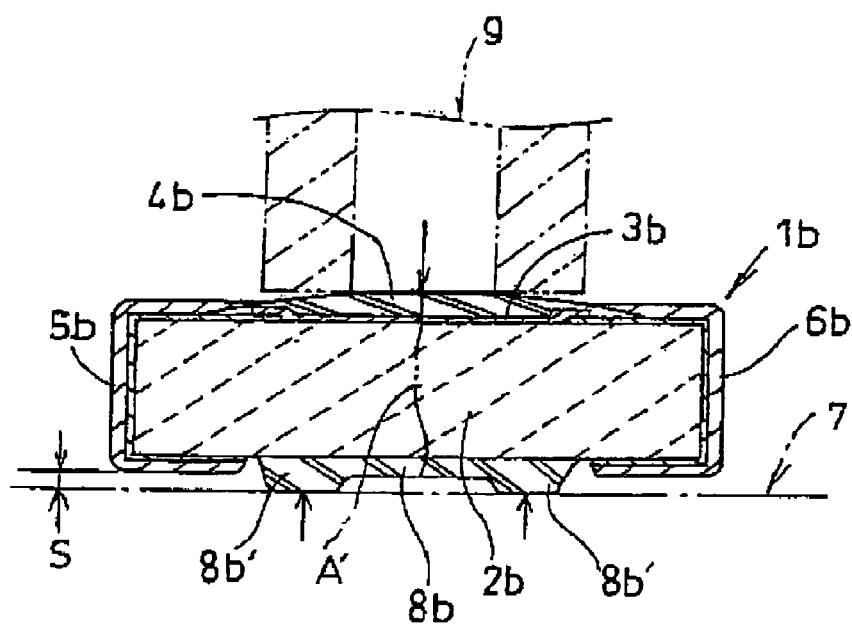
FIG. 7 is a longitudinal sectional view showing another conventional chip resistor.

Further, since the ridge 18a' of the peak portion 18 of the projection 18 extends in the width direction of the insulating substrate 12, the entirety of the ridge 18a' comes into contact with the surface of the printed circuit board 7 when the chip resistor 11 is supplied to a predetermined mount position of the printed circuit board 7 with vacuum suction by the collet nozzle 9, as shown in FIG. 3. Therefore, the downward pressing force by the collet nozzle 9 can be supported by the printed circuit board 7 via the ridge 18a' extending in the width direction. As a result, the bending moment to bend the insulating substrate 12 in the width direction is prevented from being exerted on the insulating substrate 12.

Preferably, to reduce the bending moment exerted on the insulating substrate 12 to bend the insulating substrate as much as possible or prevent such bending moment from being exerted on the insulating substrate 12, it is preferable that the height H of the peak portion 18a of the projection 18 is set close to the projecting dimension T of the terminal electrode films 15 and 16 from the lower surface 12a of the insulating substrate 12. The projection 18 may be made of heat-resistant synthetic resin instead of glass.

The chip-resistor 11 having the above-described structure can be manufactured by the method described below.

First lower electrodes 15b and 16b are formed on the lower surface 12a of an insulating substrate 12 in the form of a chip by screen printing of a material paste and the subsequent baking at a temperature of approximately 850° C.

Subsequently, upper electrodes 15a and 16a are formed on the upper surface of the insulating substrate 12 by screen printing of a material paste and the subsequent baking at a temperature of approximately 850° C.

Subsequently, a resistor film 13 is formed on the upper surface of the insulating substrate 12 by screen printing of a material paste and the subsequent baking at a temperature of approximately 850° C.

Subsequently, an undercoat of a cover coat 14 for covering the resistor film 13 is formed by screen printing of a material paste and the subsequent baking at a temperature of approximately 600° C.

Subsequently, aprojection18 is formed on the lower surface 12a of the insulating substrate 12 by screen printing of a material paste and the subsequent baking at a temperature of approximately 600° C.

Subsequently, trimming of the resistor film 13 is performed to adjust the resistance to a predetermined value. Thereafter, an overcoat of heat-resistant synthetic resin as a part of the cover coat 14 is formed by screen printing of the material and the subsequent hardening at a temperature of approximately 200° C.

Subsequently, side electrodes 15c and 16c are formed on opposite end surfaces of the insulating substrate 12 by the application of a material paste and the subsequent hardening.

Subsequently, metal plating layers 15d, 16d are formed on the upper electrodes 15a, 16a, the lower electrodes 15b, 16b and the side electrodes 15c, 16c by barrel plating, whereby the chip resistor 11 is completed.

When the overcoat of the cover coat 14 is to be made of glass, the overcoat of glass is formed, after the trimming adjustment, by screen printing of a material paste and the subsequent baking.

When the projection 18 is to be made of heat-resistant synthetic resin, the projection 18 is formed, after the formation of the overcoat, by screen printing of a material and the subsequent hardening.

Although a chip resistor including a resistor film as an element mounted on an insulating-substrate in the form of a chip is described in the foregoing embodiment, the present invention is not limited thereto. For instance, the present invention is also applicable to a chip-type component such as a chip capacitor including a capacitor element mounted on an insulating substrate.

The invention claimed is:

1. A chip-type component comprising:
   an insulating chip substrate that includes an upper surface and a lower surface, the upper surface being provided with an electric element and a cover coat covering the element; and terminal electrode films for the element, the films being formed at opposite ends of the insulating substrate and having a portion extending on the lower surface of the insulating substrate;
   wherein the lower surface of the substrate is provided with an insulating projection between the terminal electrode films, the projection including a peak portion positioned at or near a center of the insulating substrate in a longitudinal direction of the substrate along which the terminal electrode films are spaced from each other, and
   wherein the peak portion of the projection comprises a straight ridge extending in a width direction perpendicular to the longitudinal direction of the insulating substrate along which the terminal electrode films are spaced from each other, the straight ridge being equal in length to a width of the lower surface of the substrate.

2. The chip-type component according to claim 1, wherein the peak portion of the projection is substantially same in height with respect to the lower surface of the substrate as the portion of the terminal electrode films extending on the lower surface of the insulating substrate.

3. The chip-type component according to claim 1, further comprising an additional insulating projection provided on the upper surface of the substrate between the terminal electrode films, wherein the additional insulating projection includes a peak portion positioned at or near a center of the insulating substrate in the longitudinal direction of the substrate.

4. A method of manufacturing a chip-type component, the method comprising the steps of:

forming an electric element and a cover coat for covering the element on an upper surface of an insulating chip substrate;

forming terminal electrode films at opposite ends of the insulating substrate for electrical connection to the element, the terminal electrode films extending onto a lower surface of the insulating substrate; and forming an insulating projection on the lower surface of the insulating substrate between the terminal electrode films, the projection including a peak portion positioned at or near a center of the insulating substrate in a longitudinal direction of the substrate along which the terminal electrode films are spaced from each other, the peak portion including a straight ridge extending in a width direction perpendicular to the longitudinal direction of the insulating substrate along which the terminal electrode films are spaced from each other, the straight ridge being equal in length to a width of the lower surface of the substrate.

* * * * *